United States Patent [19]

Beg

[11] Patent Number: 5,027,046
[45] Date of Patent: Jun. 25, 1991

[54] CIRCUIT AND METHOD FOR MONITORING VOLTAGE PULSE WIDTHS

[75] Inventor: Mirza A. Beg, Lima, Ohio

[73] Assignee: Westinghouse Electric Corp., Pittsburgh, Pa.

[21] Appl. No.: 529,842

[22] Filed: May 29, 1990

[51] Int. Cl.⁵ .................. G01R 23/02; H03K 5/22
[52] U.S. Cl. .................... 318/603; 318/599; 307/518; 328/111; 324/78 R
[58] Field of Search ................ 318/599–630; 307/267, 234, 265, 518; 328/111, 116, 120, 133, 155; 324/78 R, 78 D, 79 D

[56] References Cited

U.S. PATENT DOCUMENTS

| | | |
|---|---|---|
| 3,908,132 | 9/1975 | Krampe et al. |
| 4,230,991 | 10/1980 | Paphitis ........................ 324/78 RX |
| 4,330,746 | 5/1982 | Stulting et al. ................ 324/78 D |
| 4,400,664 | 8/1983 | Moore ............................ 328/133 X |
| 4,611,926 | 9/1986 | Hayashi .......................... 360/120 |
| 4,675,597 | 6/1987 | Hernandez ..................... 328/111 X |
| 4,707,142 | 11/1987 | Baker et al. |
| 4,849,704 | 7/1989 | Thornton. |
| 4,864,158 | 9/1989 | Koelle et al. .................. 307/518 X |
| 4,884,035 | 11/1989 | Cok et al. ........................ 328/133 |
| 4,939,396 | 7/1990 | Schoettmer ..................... 307/518 |

Primary Examiner—Paul Ip
Attorney, Agent, or Firm—R. P. Lenart

[57] ABSTRACT

The widths of pulses in an incoming pulse train are monitored by successively measuring the duration of the pulses in the pulse train and enabling a timing device when the duration of any of the pulses is more than a preselected magnitude. The timing device is reset and restarted when the duration of any of the pulses is greater than the preselected magnitude. An output signal, indicative of an acceptable condition, is produced when the timing device indicates the expiration of a predetermined time delay. An output signal, indicative of a non-acceptable condition, is produced when the duration of a pulse in the incoming pulse train exceeds the preselected magnitude. This invention encompasses both the pulse width monitoring method and circuits which perform this method.

6 Claims, 2 Drawing Sheets

CIRCUIT AND METHOD FOR MONITORING VOLTAGE PULSE WIDTHS

BACKGROUND OF THE INVENTION

This invention relates to electronic pulse width monitors and, more particularly, to such monitors which provide an output signal indicative of whether successive voltage pulses occurring over a predetermined time period have a duration which is less than a preselected duration AC electric power systems are usually connected in parallel to increase total system rating or in certain cases such as airborne power systems, to increase reliability. One well-known type of aircraft electric power system is the DC link variable speed constant frequency (VSCF) system. Such systems include a plurality of power pole switching elements which synthesize an AC output by switching current from a pair of DC link conductors in a fixed switching pattern, which may be generated by a microprocessor or other digital circuit When these systems are to be operated in parallel with each other or with another source such as a ground power cart, each of the power sources must be synchronized. Since DC link VSCF systems are clock-based, a master clock signal is used to synchronize each of the system channels The clock provides a single digital signal used to synchronize each channel No break power transfer (NBPT) is a special application of a parallel system which allows momentary paralleling with another power source. The other source is typically an auxiliary power unit (APU) or a ground power unit (GPU) For NBPT, the master clock should be able to track the frequency of the external source The master clock system includes a phased locked loop with selectable inputs from the APU, GPU, or a crystal frequency reference counted down to 400 Hz.

During NBPT, there is a transient due to mismatched phase angles and magnitudes of the two system voltages about to be momentarily paralleled. Severe transients and tripping of the VSCF system could result if excessive phase error exists prior to NBPT. To minimize such transients, it is necessary to ensure proper phase angle matching prior to paralleling. A phase detector is used to provide an error signal that is representative of the phase error between the VSCF system and the selected reference input.

One type of phase detector, as illustrated in U.S. Pat. No. 4,849,704 issued July 18, 1989, provides a phase error signal in the form of a pulse train, with the widths of the individual pulses being proportional to the phase error. A circuit is needed to monitor the widths of the pulses in the phase error signal and to provide an indication if the phase error exceeds a preset value to prevent NBPT.

SUMMARY OF THE INVENTION

This invention provides a method for monitoring and reporting the pulse widths in a pulse train independent of the duty cycle of the pulse train. A particular application of this method is for monitoring the pulse widths in a phase error signal for use in phase locked loop applications. The pulse widths of the phase error pulse signal are compared against a user programmed pulse width limit. If the pulse width exceeds the programmed limit, an output signal indicative of a non-acceptable condition is produced and a user programmable time delay is initiated. This time delay is reset to zero and restarted each time one of the pulses in the pulse train has a width which exceeds the limit After the preset time delay has elapsed, indicating that no pulse has exceeded the limit during the time delay period, an indication to the effect that the incoming pulses are within the limit is provided.

Accordingly, this invention provides a method for monitoring the widths of pulses in a pulse train which includes the steps of successively measuring the duration of a plurality of pulses in a pulse train and starting a timing device when the duration of any of the pulses is more than a preselected magnitude. The timing device is reset and restarted when the duration of any of the pulses is more than the preselected magnitude, and an output signal, indicative of a non-acceptable condition is produced. An output signal, indicative of an acceptable condition, is produced when the timing device indicates the expiration of a predetermined time delay. This invention also encompasses a circuit for performing the above pulse width monitoring method. This invention may be used to ensure proper phase angle matching prior to the paralleling of two power sources. By requiring that all of the phase error signal pulses are below a preset duration limit for a certain time delay period before an output signal indicative of an acceptable condition is produced, immunity against random noise is provided

BRIEF DESCRIPTION OF THE DRAWINGS

The invention will become more readily apparent from the following description of the preferred embodiment thereof, as shown in the drawings wherein.

DESCRIPTION OF THE PREFERRED EMBODIMENT

Figure 1:
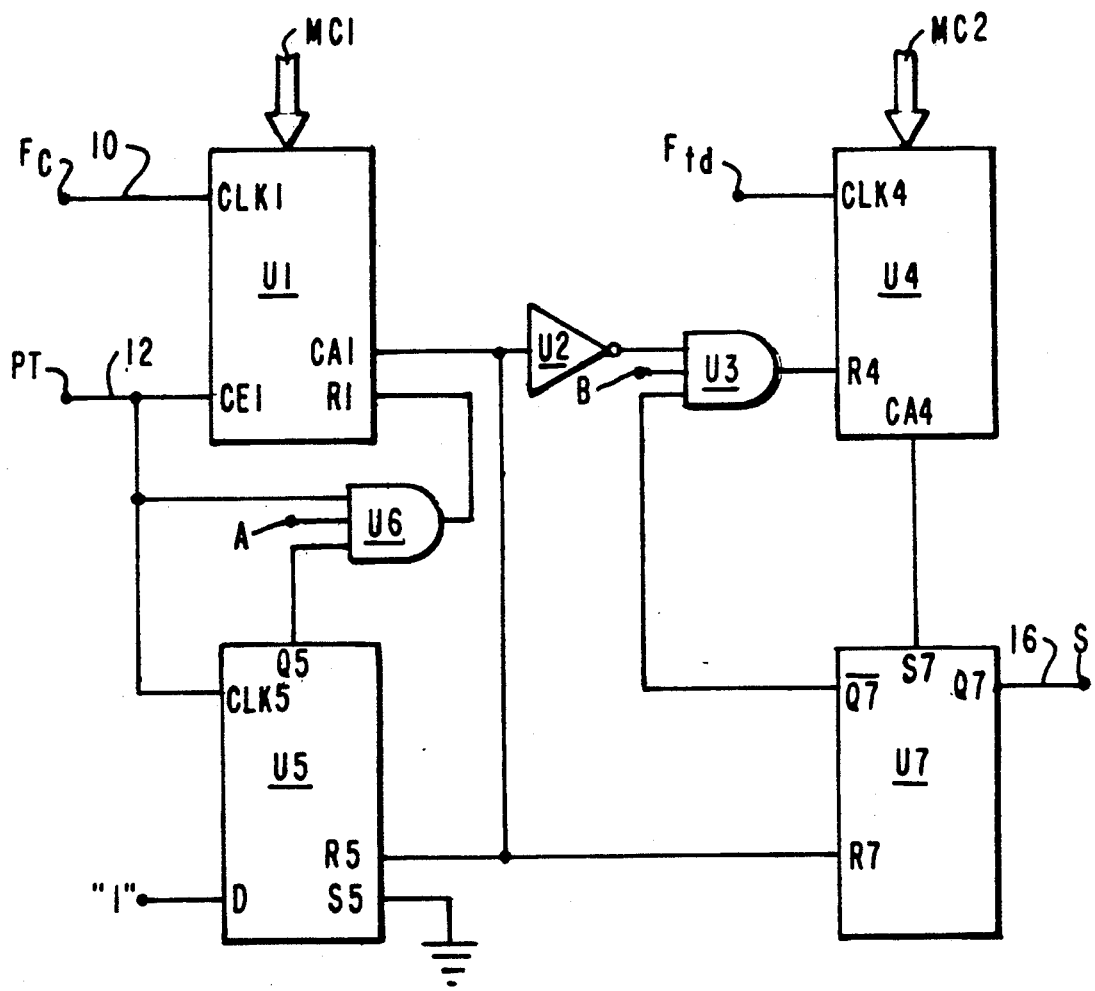
FIG. 1 is a block diagram of a circuit constructed in accordance with one embodiment of the present invention.

Referring to the drawings, FIG. 1 is a schematic diagram of a circuit constructed in accordance with the preferred embodiment of the present invention. A first presettable counter U1 receives a clock signal FC on line 10, and a pulse train signal PT on line 12. In this embodiment, the pulse train signal is a series of voltage pulses, each having a width representative of the phase error between two electrical power sources. This signal may be provided by the phase detector illustrated in the previously mentioned U.S. Pat. No. 4,849,704. The carry output CA1 of counter U1 is connected through inverter U2 and AND gate U3 to the reset terminal R4 of a second presettable counter U4. The second presettable counter receives a second clock signal $F_{td}$ on line 14. This second clock signal may be the same signal as the first clock signal $F_C$; however, in the preferred embodiment it is a lower frequency clock signal.

A type D flip-flop circuit U5 also receives the pulse train PT at its clock input CLK5 Its D input is tied to a logic high level and its set input S5 is tied to ground. An AND gate U6 receives the pulse train PT and the output signal Q5 of the type D flip-flop U5 to produce a reset signal at the reset terminal R1 of the first presettable counter U1. A type R/S flip-flop circuit U7 has a set input S7 connected to the carry output CA4 of the second programmable counter U4. The $\overline{Q7}$ output of flip-flop U7 is connected to an input of AND gate U3.

The reset terminals of flip-flops U5 and U7 are connected to receive the output signal from the carry output CA1 of counter U1.

The circuit of FIG. 1 compares the pulse widths of the incoming pulse train PT to a preset time limit established by the number of pulses in clock signal $F_C$ necessary for counter U1 to reach its preset count MC1. Once the incoming pulses in pulse train PT exceed the preset duration limit, a time delay is initiated after counter U4 is reset. This time delay is equal to the number of pulses in the second clock signal $F_{td}$ required for the second counter U4 to reach its preset count MC2. At the end of the time delay established by counter U4, the carry output CA4 goes to a logic high level and the R/S flip-flop U7 produces an output signal S on line 16.

The time delay established by counter U4 is reset and restarted each time a pulse in pulse train PT exceeds a preset limit. This time delay provides noise immunity and is user-programmable by changing the preset count MC2 in counter U4. The frequency of the second clock signal $F_{td}$ can also be adjusted to control the time delay.

Figure 2:
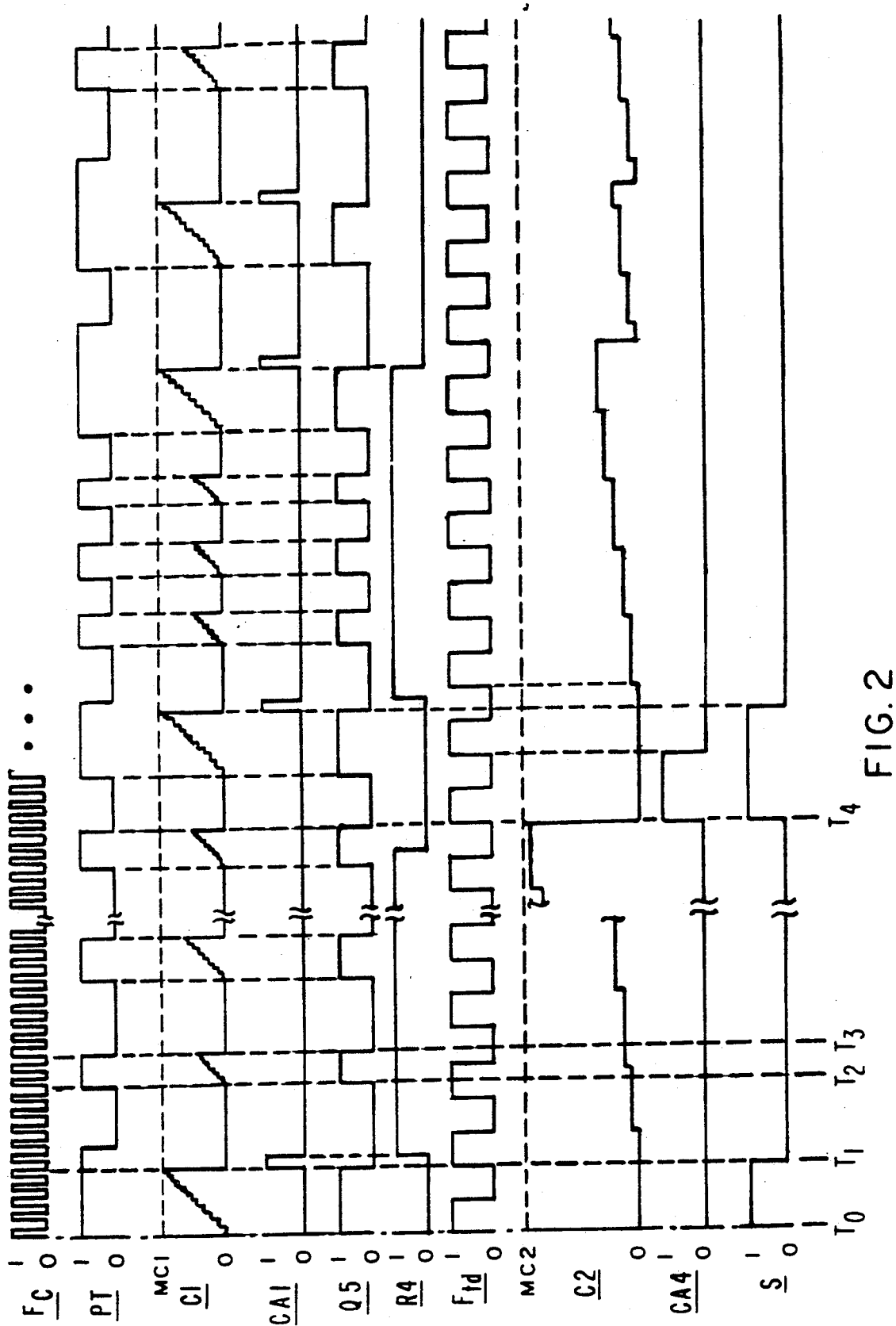
FIG. 2 is a series of waveforms which illustrate the operation of the circuit of FIG. 1.

The operation of the circuit of FIG. 1 is illustrated by the waveforms of FIG. 2. In FIG. 2, the waveform identifiers are identical to the terminals at which the waveforms occur in FIG. 1, with the exception that waveform C1 is a symbolic representation of the count in counter U1 and waveform C2 is a symbolic representation of the count in the second counter U4. A maximum limit for the widths in the pulses in pulse train PT is set by the preset count MC1 in counter U1 and the reference frequency FC as shown by the equation: $T_{max} = MC1/FC$. The circuit of FIG. 1 is set to a predetermined state at power-up by providing a momentary logic low signal to inputs A and B of AND gates U6 and U3 respectively. This results in a logic low signal at reset terminals R1 and R4, thereby resetting counters U1 and U4. Once U1 and U4 have been reset, a logic high signal is supplied to inputs A and B. A rising edge of the incoming pulse in pulse train PT changes the output Q5 of the type D flip-flop U5 to a logic high level Q5 and the incoming pulse are combined in AND gate U6 to remove the reset signal from the reset terminal R1 of counter U1. With this reset signal removed from counter U1, counter U1 starts counting $F_C$ pulses. Counter U1 will generate a carry pulse (having a period equal to one period of the clock signal $F_C$) if the incoming pulse width of a pulse in signal PT exceeds the preset time $T_{max}$. This carry pulse will reset the type D flip-flop U5, thereby driving its output Q5 to a logic low state. A logic low at Q5 will cause AND gate U6 to reset counter U1 to a count of zero. The carry output pulse of counter U1 also resets the R/S flip-flop U7, thus forcing the output signal S at terminal Q7 to a logic low level. This indicates that a pulse width in signal PT has exceeded the preset limit $T_{max}$. The carry pulse from counter U1 also resets counter U4 through gates U2 and U3. After the carry pulse from counter U1 goes to a logic low state, counter U4 is enabled by forcing reset terminal R4 to a logic high level.

Because of the asynchronous nature of the incoming pulses in pulse train PT and the clock signal $F_C$, a maximum error of one $F_C$ clock period can occur in measuring the pulse widths.

At time $T_0$, the incoming pulse train PT changes from a logic zero to a logic one. This initiates counter U1 such that it counts clock pulses in clock signal $F_C$. At time T1, the counter U1 reaches its preset count MC1. A carry pulse CA1 is generated which results in a low level at R4 that resets counter U4 so that count C2 returns to zero. At the same time, the output signal S returns to zero. The output signal S will remain zero until the count C2 in counter U4 reaches its preset count MC2 provided that no carry pulse CA1 is generated.

Next, consider the case when the incoming pulse in pulse train PT is less than the preset limit established by the preset count MC1 in counter U1. At time $T_2$, the rising edge of a pulse in pulse train PT enables counter U1 as described earlier. In the case, the incoming pulse in pulse train PT will go low at time T3 before counter U1 reaches its terminal count MC1. The logic low level of the incoming pulse in pulse train PT through gate U6 will reset counter U1 to its initial count of zero. Since the preset count MC1 of counter U1 has not been reached, no carry pulse is generated at terminal CA1. As long as the incoming pulses are within the preset pulse width limit, carry pulses are not generated by counter U1. The absence of a carry pulse at terminal CA1 will keep counter U4 enabled through gates U2 and U3, such that the count C2 in counter U4 continues to increase. Counter U4 provides a time delay TD which is set by the terminal count MC2 and the reference frequency $F_{td}$ as shown by: $TD = MC2/F_{td}$. If no carry pulse appears at the carry output CA1 of counter U1 during the time delay period, counter U4 generates a carry pulse at terminal CA4 as illustrated at time $T_4$ in FIG. 2. This carry pulse at terminal CA4 will set the R/S flip-flop U7 such that its output S switches to a logic high level, thereby indicating that the incoming pulses have widths which have been within the preset limit $T_{max}$ for the last TD seconds. This provides immunity against random noise in the system. The carry pulse at terminal CA4 also resets counter U4 to an initial count of zero through the R/S flip-flop U7 and AND gate U3. Counter U4 will be enabled again only by a carry pulse at terminal CA1 of counter U1 as described above.

As long as Q7 is high (meaning incoming pulses are within the preset limit), counter U4 is disabled because $\overline{Q7}$ is low and R4 is held low. When an incoming pulse has a duration sufficient to let counter U1 exceed its preset count MC1, a carry pulse CA1 is generated. This causes R7 to go low, resetting U7 so that Q7 goes low, thereby indicating an unacceptable condition. $\overline{Q7}$ will go high but R4 remains low because CA1 is high. When CA1 goes low after one cycle of $F_c$, R4 goes high and U4 starts counting, thereby initiating the time delay.

It should now be apparent that the present invention provides a method for monitoring the widths of pulses in a pulse train which successively measures the duration of the incoming pulses. A timing device is reset and restarted when the duration of an incoming pulse is more than the preselected magnitude, and an output signal, indicative of an unacceptable condition is produced. An output signal, indicative of an acceptable condition, is produced when the timing device indicates the expiration of a predetermined time delay.

Although the present invention has been described in terms of what is believed to be its preferred embodiment, it will be apparent to those skilled in the art that various changes may be made without departing from the scope of the invention. It is therefore intended that the appended claims cover such changes

What is claimed is:

1. A method for monitoring the widths of pulses in a pulse train, said method comprising the steps of:

starting a timing device for measuring a predetermined time delay;

successively measuring the duration of a plurality of pulses in a pulse train;

resetting and restarting said timing device when the duration of any of said pulses is more than a preselected magnitude;

producing an output signal indicative of a non-acceptable condition prior to the expiration of said predetermined time delay; and producing an output signal indicative of an acceptable condition when said timing device indicates the expiration of said predetermined time delay.

2. A method for monitoring the widths of pulses in a pulse train, as recited in claim 1, wherein said step of successively measuring the durations of a plurality of pulses in a pulse train comprises the steps of:

counting a plurality of clock pulses in a first clock signal occurring when each of said pulses in said pulse train is at a first predetermined logic level to produce a first count;

resetting said first count when each of said pulses in said pulse train changes from said first predetermined logic level to a second predetermined logic level; and producing a reset signal when said first count reaches a predetermined maximum value.

3. A method for monitoring the widths of pulses in a pulse train, as recited in claim 2, wherein said timing device counts a plurality of clock pulses in a second clock signal to produce a second count and said step of resetting and restarting said timing device comprises the steps of:

resetting said second count in response to said reset signal; and producing said output signal indicative of an acceptable condition when said second count reaches a second predetermined magnitude.

4. A circuit for monitoring the widths of pulses in a pulse train, said circuit comprising:

means for successively measuring the duration of a plurality of pulses in a pulse train;

a timing device for measuring a predetermined time delay;

means for enabling said timing device when the duration of any of said pulses is less than a preselected magnitude;

means for resetting and restarting said timing device when the duration of any of said pulses is more than said preselected magnitude; and means for producing an output signal indicative of a non-acceptable condition prior to the expiration of said predetermined time delay, and for producing an output signal indicative of an acceptable condition when said timing device indicates the expiration of said predetermined time delay.

5. A circuit for monitoring the widths of pulses in a pulse train, as recited in claim 4, wherein said means for successively measuring the durations of a plurality of pulses in a pulse train comprises:

a first counter for counting a plurality of clock pulses in a first clock signal occurring when each of said pulses in said pulse train is at a first predetermined logic level to produce a first count;

means for resetting said first counter when each of said pulse in said pulse train changes from said first predetermined logic level to a second predetermined logic level; and means for producing a reset signal when said first count reaches a predetermined maximum value.

6. A circuit for monitoring the widths of pulses in a pulse train, as recited in claim 5, wherein said timing device includes a second counter for counting a plurality of clock pulses in a second clock signal to produce a second count and said means for enabling a timing device comprises:

means for resetting said second counter in response to said reset signal; and means for producing an output signal when said second count reaches a second predetermined magnitude.

* * * * *